(12) United States Patent
Li et al.

(10) Patent No.: US 11,531,790 B2
(45) Date of Patent: Dec. 20, 2022

(54) TOOL STRING DESIGN USING MACHINE LEARNING

(71) Applicant: Halliburton Energy Services, Inc., Houston, TX (US)

(72) Inventors: Jian Li, Bellaire, TX (US); Bin Dai, Spring, TX (US); Christopher Michael Jones, Katy, TX (US); James M. Price, Cypress, TX (US); Cameron M. Rekully, Kingwood, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 186 days.

(21) Appl. No.: 16/733,887

(22) Filed: Jan. 3, 2020

(65) Prior Publication Data

US 2021/0209262 A1 Jul. 8, 2021

(51) Int. Cl.
*G06F 30/13* (2020.01)
*E21B 41/00* (2006.01)
*G06F 30/27* (2020.01)

(52) U.S. Cl.
CPC .............. *G06F 30/13* (2020.01); *E21B 41/00* (2013.01); *G06F 30/27* (2020.01); *E21B 2200/22* (2020.05)

(58) Field of Classification Search
CPC ......... G09G 3/3426; G09G 2320/0626; G09G 2320/0233; G09G 2330/025; G09G 2310/02; G09G 3/3406
See application file for complete search history.

(56) References Cited

U.S. PATENT DOCUMENTS

| | | | |
|---|---|---|---|
| 8,065,244 B2 * | 11/2011 | Chen | G06N 3/0454 706/15 |
| 9,483,586 B2 | 11/2016 | Bailey et al. | |
| 2017/0270225 A1 * | 9/2017 | Chen | E21B 47/00 |
| 2018/0320516 A1 * | 11/2018 | Price | E21B 44/00 |
| 2019/0063215 A1 | 2/2019 | Dai et al. | |
| 2019/0130148 A1 | 5/2019 | Chinya et al. | |
| 2019/0345809 A1 | 11/2019 | Jain et al. | |

FOREIGN PATENT DOCUMENTS

WO 2019133873 A1 7/2019

OTHER PUBLICATIONS

Foreign Communication from related application—International Search Report and Written Opinion of the International Searching Authority, International Application No. PCT/US2020/012770, dated Sep. 21, 2020, 12 pages.

(Continued)

*Primary Examiner* — Steven W Crabb
(74) *Attorney, Agent, or Firm* — Conley Rose, P.C.; Rodney B. Carroll

(57) ABSTRACT

A method for designing a tool string for use in a wellbore includes receiving a merit function, and determining, with a computing system and based on the merit function, a tool string design for a tool string. The merit function comprises one or more defined objectives for performing a process in a wellbore. The tool string design comprises an indication of one or more tools used to form a tool string for performing the process in the wellbore, and the tool string design satisfies the merit function.

19 Claims, 5 Drawing Sheets

(56) References Cited

OTHER PUBLICATIONS

Aharon, Michal, et al., "K-SVD: An Algorithm for Designing Overcomplete Dictionaries for Sparse Representation," EEE Transactions on Signal Processing, Nov. 2006, pp. 4311-4322. vol. 54, No. 11, IEEE.
Cai, T. Tony, et al., "Orthogonal Matching Pursuit for Sparse Signal Recovery With Noise," IEEE Transactions on Information Theory, Jul. 2011, pp. 4680-4688, vol. 57, No. 7, IEEE.
Li, J., et al., "An Adaptable Optical Sensor for Chemometric Analysis," presented at the ISA 63rd Annual Symposium at the Analysis Division, Galveston, Texas, Apr. 22-26, 2018, 16 pages.

\* cited by examiner

TOOL STRING DESIGN USING MACHINE LEARNING

BACKGROUND

Modern petroleum drilling and production operations rely on a great quantity of information relating to the parameters and conditions downhole. Such information typically includes the location and orientation of the wellbore and drilling assembly, earth formation properties, and drilling environment parameters downhole. The collection of information can be collected before hydrocarbon production begins and/or during hydrocarbon production operations. The information can be used in the hydrocarbon production process to define various parameters associated with transporting the hydrocarbons from the formation to the surface.

SUMMARY

In some embodiments, a method for designing a tool string for use in a wellbore includes receiving a merit function, and determining, with a computing system and based on the merit function, a tool string design for a tool string. The merit function comprises one or more defined objectives for performing a process in a wellbore. The tool string design comprises an indication of one or more tools used to form a tool string for performing the process in the wellbore, and the tool string design satisfies the merit function.

In some embodiments, a system for determining a tool string design includes a processor and a memory. The memory comprises a machine learning model, and the machine learning model, when executed on the processor, configures the processor to receive a merit function, wherein the merit function comprises one or more defined objectives for performing a process in a wellbore, and determine, based on the merit function, a tool string design for a tool string. The tool string design comprises an indication of one or more tools used to form a tool string for performing the process in the wellbore, and the tool string design satisfies the merit function.

In some embodiments, a method for designing a tool string for use in a wellbore includes receiving a merit function, determining, using a dictionary learning algorithm with sparse coding, one or more atoms based on the merit function, and determining a tool string design based on the one or more atoms. The merit function comprises one or more defined objectives for performing a tool string process in a wellbore, and the dictionary learning algorithm uses a dictionary of system parameters. A plurality of atoms are defined by combinations of the system parameters from the dictionary, and the plurality of atoms represent a sparse representation of the system parameters. The tool string design comprises an indication of one or more tools used to form a tool string for performing the tool string process in the wellbore, and the tool string design satisfies the merit function.

In some embodiments, a method for designing an optical element for use in a wellbore includes receiving a merit function, and determining, with a computing system and based on the merit function, an optical element design. The merit function comprises one or more defined optical characteristics for an optical element for use in a wellbore, and the tool string design satisfies the merit function.

These and other features will be more clearly understood from the following detailed description taken in conjunction with the accompanying claims.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

DESCRIPTION

Figure 1:
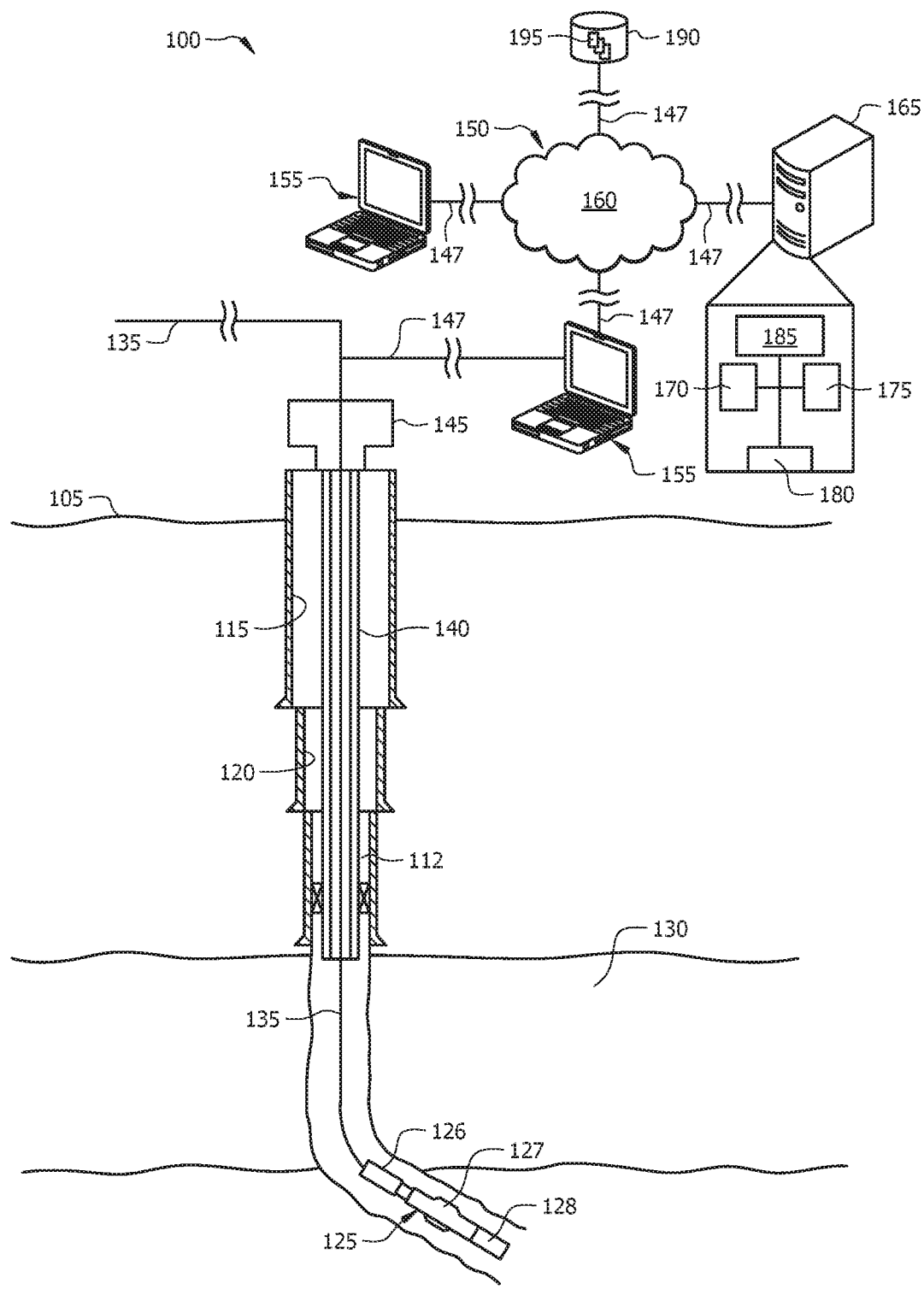
FIG. 1 schematically illustrates a wellbore environment according to an embodiment.

In order to obtain information from within a wellbore, various tools, combinations of tools in a string (e.g., a tool string), and processes or procedures (e.g., tool string processes) can be performed in a wellbore. The processes can be used to obtain testing or sensor data, perform workover procedures, reconfigure a completion assembly or the like. Often, the tool string design is selected based on a standard practice that does not take into account information pertaining to the particular wellbore being serviced, the operating conditions, or the other equipment available at the wellbore location. Further, any particular tool string design may simply be a combination of one or more tools without regard to how the tools can be ordered to used to more efficiently perform the process. Still further, the tools may be selected by individuals who do not have the benefit of prior use of the same tools or other tool string designs that may be more efficient.

Disclosed herein are systems and methods to enable the identification of a tool string design comprising one or more tools for performing a defined process. Machine learning can be used to analyze historical data and provide a tool design based on a defined set of constraints or parameters for one or more tool string processes to be performed with the tool string. The resulting tool string design can then represent an improved tool string design relative to previous designs. The determined tool string design can identify specific tools to be used, an order of the tools in the tool string, operating parameters for the tools, and other parameters to help to improve the efficiency of the tool string processes. In some instances, the tool design model can identify the need for two or more tool string designs to be used in subsequent tool string processes. The identification of the two or more designs can help to identify an order of the processes to be performed to improve the overall efficiency of the processes within the specific environment or wellbore being serviced.

The machine learning model can use dictionary learning and sparse coding to help improve the efficiency of the machine learning model. This type of machine learning can provide an optimized or improved tool string design while also reducing the computational time and resources needed to determine the tool string design and improving the accuracy of the results. This can allow for real-time or near real-time determinations of the tool string design(s) based on last minute data available from the wellbore.

The dictionary learning model can use a dictionary of tool parameters, tool string design parameters, operating parameters, and the like. Combinations of these parameters (e.g., that can be referred to as "atoms" herein) representing specific tool string design(s) can be determined from the dictionary of parameters. Sparse coding can then be used with the atoms and historical data for various tool string processes across multiple wells to identify a relatively small subset of tool string designs (e.g., a set of atoms) that can be used to obtain the desired results from one or more tool string processes within the wellbore. The machine learning model can then accept constraints or conditions for one or more tool string processes and provide an output comprising one or more atoms that can define a tool string design for the one or more tool string processes. Thus, the machine learning model can provide insights into optimal or improved tool string designs across a varied data set of tool string processes in various wells.

Turning to FIG. 1, an exemplary embodiment of a wellbore environment 100 is illustrated with a tool string 125 passing through the well 100. Components of the well 100 and the tool string 125 can be communicably coupled with a distributed computing system 150 that includes a modeling system 185 operable to determine one or more configurations of the tool string 125, for example, the selection of one or more tools used to build the tool string 125 for use in performing one or more processes in the well 100.

The illustrated well 100 includes the wellbore 110 extending to and/or through one or more subterranean zones, such as the illustrated subterranean zone 130, from a surface 105 of the earth. Although illustrated as extending from the surface 105, the wellbore 110 may be formed from the Earth's surface at a location under a body of water rather than the surface 105. In other words, in some embodiments, the surface 105 may be an ocean, gulf, sea, or any other body of water. In short, reference to the surface 105 includes both land and water surfaces and contemplates forming and/or developing one or more wellbores from either or both locations.

One or more strings of casing may be set in place in the wellbore 110. For example, the illustrated well system 100 includes a conductor casing 115, which extends from the surface 105 shortly into the earth. A portion of the wellbore 110 enclosed by the conductor casing 115 may be a large diameter borehole. Downhole of the conductor casing 115 may be additional lengths of casing 120. The casing 120 may enclose a slightly smaller borehole and protect the wellbore 110 from intrusion of, for example, freshwater aquifers located near the surface 105, and/or isolate hydrocarbon production from specific zones.

The illustrated wellbore 110 includes a substantially vertical portion and a directional portion. The vertical portion of the wellbore 110 may extend generally vertically downward toward a kickoff point and then turn at an angle towards the directional (e.g., radiused, slant, horizontal) portion of the wellbore 110. Although illustrated as a substantially vertical wellbore with a directional portion extending from the vertical portion, the present disclosure contemplates that vertical, directional, horizontal, slant, articulated, radiused, and other types of wellbores may be included and/or formed within the well system 100.

Continuing with FIG. 1, as illustrated, the wellbore 110 extends into and through a subterranean formation 130. The illustrated subterranean formation 130 can be a hydrocarbon-bearing formation, such as, for example, shale, sandstone, coal, or other geologic formation that contains oil, gas, or other hydrocarbons, but could be other types of formations. Once the wellbore 110 is formed, the basic physics underlying production involves a migration of fluids (liquids and/or gas) through permeable rock formations such as the subterranean formation 130 to areas of lower pressure created by the wellbore 110. These fluids may then flow through a casing of the wellbore 110 or an open hole completion and are eventually brought to the surface.

Extending above the surface 105, as illustrated, is a wellhead 145. The wellhead 145 can contain or be coupled to a broad array of components, including sensors (e.g., temperature, pressure, flow, and other sensors), valves, blow-out-preventers, snubbing heads, and other components. The wellhead 145 may support a tubular, such as a production tubing string 140 extending through the annulus 112 of the wellbore 110. In some embodiments, the tubing string 140 may receive the tool string 125 as it is run into the well 100. Here, the tool string 125 is depicted as being conveyed on a line 135, but in other instances, the tool string 125 may incorporate additional tubing, including jointed or coiled tubing, for conveying the tools thereof into and out of the well 100. The line 135 may be any type of line for conveying the tool string 125 into and out of the well 100, including wireline, slickline, electric (e-line), and other. In the present example, the line 135 is an electric line (e-line) that facilitates a supply of electric power, control, and data between the surface 105 (e.g., from computing system 150 or other control system or controller) and the tool string 125. Typically, the electric line 135 may be connected by a drum and spooled off of a wireline truck to a wireline sheave. In certain instances, conveyance of the tool string 125 through the well can be assisted, for example, by well tractor, autonomous well robot, by being pumped, and or in another manner.

The electric line 135 can be coupled to the tool string 125, which comprises one or more well tools such as well tools 126, 127, and 128. Although three well tools are illustrated as part of the tool string 125, there may be more (e.g., four or more), or fewer (e.g., one tool, two tools, etc.), well tools as part of the tool string 125 depending on, for instance, the type of tool string process (e.g. logging, sensing, workover, procedure, operation, etc.) performed by the tool string 125.

For purposes of the disclosure herein, the tool string, alternatively referred to as a wellbore servicing tool, downhole tool used to perform one or more tool string processes, or more simply a tool, may refer to an operable assembly of components that performs a specific function within a wellbore environment and/or may be integrated (e.g., connected, coupled, attached, etc.) within a conveyance string or line 135 (e.g., a work string, a drill string, a drill stem, a tool string, a segmented tubing string, a jointed tubing string, a coiled tubing string, a wireline string, a slickline string, etc.) and placed downhole within the wellbore 110. For example, a tool string 125 may be connected to a lower end of a conveyance string and placed in a desired location in the wellbore 110 (e.g., adjacent an area to be serviced in a tool string process via the tool). Nonlimiting examples of specific functions that may be performed by a tool string 125 can include measuring and/or monitoring a downhole environment parameter, such as for example a downhole pressure, a downhole temperature; sealing and/or isolating zones or portions of a subterranean formation 130; actuating a component or a sub-component of a tool, such as for example opening and/or closing a valve, opening and/or closing a port, allowing fluid passage between an interior flowbore and/or an exterior flowbore (e.g., annular flowbore); and the like. In some embodiments, one or more tools within a tool string 125 can be dynamic within the wellbore 110 and/or subterranean formation 130 (e.g., the downhole servicing tool is characterized by performing or undergoing work, change, activity, progress, movement, action, articulation, and the like), upon being introduced to the wellbore 110 and/or subterranean formation 130 in order to facilitate completion of a desired wellbore service or tool string process.

In some embodiments, a tool or tool string 125 can be any suitable combination of components assembled and placed within the wellbore 110 for purposes of performing a tool string process, which can include, but is not limited to, drilling, testing, completing, working over, stimulating, perforating, fracturing, repairing, otherwise servicing the wellbore, or in any way preparing the wellbore for the recovery of materials residing in a subterranean formation penetrated by the wellbore. For example, a downhole servicing tool may be a carrier, a gauge carrier, a gauge, a recorder, a port, a slot, a carrier gun, a piston assembly, a valve, a bypass valve, a valve assembly, a shut-in valve, a circulation valve, a reverse circulation valve, a safety valve, a drain valve, a drill stem testing tool, a nozzle, a packer, a safety joint, a sample container, a perforating gun, a perforated pipe, a shoe, a sampling tool, a logging tool, a drill stem testing tool, a fracturing tool, a drilling tool, a completion tool, a perforating tool, a repair tool, a workover tool, or any components thereof, etc.

The tools in the tool string 125 and/or wellhead 145 and any other sensors of the well 100 can be coupled to the computing system 150 through one or more communication links 147. Generally, the communication links 147 may be any wired or wireless communication protocol and equipment operable to transfer data (e.g., measured information, instructions, and other data), either in real-time (e.g., without intentional delay, given the processing limitations of the system and the time required to accurately measure data), near real-time (e.g., at or near real-time and accounting for some processing time but with no human-appreciable delays that are due to computer processing limitations), or at a delayed time (e.g., accounting for human user interaction, stored in a memory and analyzed at a remote time and/or location, etc.). For example, in some embodiments, the communication links 147 may facilitate transfer of data between the computing system 150 (or other computing system or controller communicably coupled to the computing system 150) and the tool string 125, wellhead 145 and/or other sensors of the well 100 during the operations (e.g., MWD, LWD, or slickline operations). Alternatively, data may be transferred before or after completion of such operations, such as, for example, after the tool string 125 has been removed to the surface 105. In any event, the present disclosure contemplates that data is transferred within an appropriate time frame commensurate with the operations or processes being performed with well system 100.

The illustrated computing system 150 can include a number of clients 155, a server system 165, and a repository 190 communicably coupled through a network 160 by one or more communication links 147 (e.g., wireless, wired, or a combination thereof). The computing system 150, generally, can execute applications and analyzes data during, before, and after one or more operations (e.g., drilling, completion, workover, and otherwise) performed by well system 100. For instance, the computing system 150 may execute the modeling system 185 to determine a tool string design for one or more tool string processes based on one or more inputs or constraints (e.g., individual inputs, a merit function, etc.).

In general, the server system 165 can be any server that stores one or more hosted applications, such as, for example, the modeling system 185. In some instances, the modeling system 185 may be executed via requests and responses sent to users or clients within and communicably coupled to the illustrated computing system 150 of FIG. 1. In some instances, the server system 165 may store a plurality of various hosted applications, while in other instances, the server system 165 may be a dedicated server meant to store and execute only a single hosted application, such as the modeling system 185.

In some instances, the server system 165 may comprise a web server, where the hosted applications represent one or more web-based applications accessed and executed via network 160 by the clients 155 of the system to perform the programmed tasks or operations of the hosted application. At a high level, the server system 165 can comprise an electronic computing device operable to receive, transmit, process, store, or manage data and information associated with the computing system 150. Specifically, the server system 165 illustrated in FIG. 1 can be responsible for receiving application requests from one or more client applications associated with the clients 155 of computing system 150 and responding to the received requests by processing said requests in the associated hosted application and sending the appropriate response from the hosted application back to the requesting client application.

In addition to requests from the external clients 155 illustrated in FIG. 1, requests associated with the hosted applications may also be sent from internal users, external or third-party customers, other automated applications, as well as any other appropriate entities, individuals, systems, or computers. As used in the present disclosure and as described in more detail herein, the term "computer" is intended to encompass any suitable processing device. For example, although FIG. 1 illustrates a single server system 165, computing system 150 can be implemented using two or more server systems 165, as well as computers other than servers, including a server pool. Indeed, server system 165 may be any computer or processing device such as, for example, a blade server, general-purpose personal computer (PC), Macintosh, workstation, UNIX-based workstation, or any other suitable device. In other words, the present disclosure contemplates computers other than general-purpose computers, as well as computers without conventional operating systems. Further, illustrated server system 165 may be adapted to execute any operating system, including Linux, UNIX, Windows, Mac OS, or any other suitable operating system.

In the illustrated embodiment, and as shown in FIG. 1, the server system 165 includes a processor 170, an interface 180, a memory 175, and the modeling system 185. The interface 180 is used by the server system 165 for communicating with other systems in a client-server or other distributed environment (including within computing system 150) connected to the network 160 (e.g., clients 155, as well as other systems communicably coupled to the network 160). Generally, the interface 180 comprises logic encoded in software and/or hardware in a suitable combination and operable to communicate with the network 160. More specifically, the interface 180 may comprise software supporting one or more communication protocols associated with communications such that the network 160 or interface's hardware is operable to communicate physical signals within and outside of the illustrated computing system 150.

As illustrated in FIG. 1, server system 165 includes a processor 170. Although illustrated as a single processor 170 in FIG. 1, two or more processors may be used according to particular needs, desires, or particular embodiments of computing system 150. Each processor 170 may be a central processing unit (CPU), a blade, an application-specific integrated circuit (ASIC), a field-programmable gate array (FPGA), or another suitable component. Generally, the processor 170 executes instructions and manipulates data to perform the operations of server system 165 and, specifically, the modeling system 185. Specifically, the server's processor 170 executes the functionality required to receive and respond to requests from the clients 155 and their respective client applications, as well as the functionality required to perform the other operations of the modeling system 185.

Regardless of the particular implementation, "software" may include computer-readable instructions, firmware, wired or programmed hardware, or any combination thereof on a tangible medium operable when executed to perform at least the processes and operations described herein. Indeed, each software component may be fully or partially written or described in any appropriate computer language including C, C++, C#, Java, Visual Basic, assembler, Perl, any suitable version of 4GL, as well as others. It will be understood that while portions of the software illustrated in FIG. 1 are shown as individual modules that implement the various features and functionality through various objects, methods, or other processes, the software may instead include a number of sub-modules, third-party services, components, libraries, and such, as appropriate. Conversely, the features and functionality of various components can be combined into single components as appropriate. In the illustrated computing system 150, processor 170 executes one or more hosted applications on the server system 165.

At a high level, the modeling system 185 is any application, program, module, process, or other software that may execute, change, delete, generate, or otherwise manage information according to the present disclosure, particularly in response to and in connection with one or more requests received from the illustrated clients 155 and their associated client applications. In certain cases, only one modeling system 185 may be located at a particular server system 165. In others, a plurality of related and/or unrelated modeling systems may be stored at a single server system 165, or located across a plurality of other server systems 165, as well. In certain cases, computing system 150 may implement a composite hosted application. For example, portions of the composite application may be implemented as Enterprise Java Beans (EJBs) or design-time components may have the ability to generate run-time implementations into different platforms, such as J2EE (Java 2 Platform, Enterprise Edition), ABAP (Advanced Business Application Programming) objects, or Microsoft's .NET, among others. Additionally, the hosted applications may represent web-based applications accessed and executed by remote clients 155 or client applications via the network 160 (e.g., through the Internet).

Further, while illustrated as internal to server system 165, one or more processes associated with modeling system 185 may be stored, referenced, or executed remotely. For example, a portion of the modeling system 185 may be a web service associated with the application that is remotely called, while another portion of the modeling system 185 may be an interface object or agent bundled for processing at a remote clients 155. Moreover, any or all of the modeling system 185 may be a child or sub-module of another software module or enterprise application (not illustrated) without departing from the scope of this disclosure. Still further, portions of the modeling system 185 may be executed by a user working directly at server system 165, as well as remotely at clients 155.

The server system 165 also includes memory 175. Memory 175 may include any memory or database module and may take the form of volatile or non-volatile memory. The illustrated computing system 150 of FIG. 1 also includes one or more clients 155. Each client 155 may be any computing device operable to connect to or communicate with at least the server system 165 and/or via the network 160 using a wireline or wireless connection.

The illustrated repository 190 may be any database or data store operable to store data 195 associated with the well system 100. Generally, the data 195 may comprise inputs to the modeling system 185, historical information of the well system 100 or other well systems, and output data from the modeling system 185. For instance, the data 195 may include input 250, as well as data from a tool specifications store 230, or a history store 235 as shown and described with reference to FIG. 2. The data 195 may also include output 270, as shown and described with reference to FIG. 2.

Figure 2:
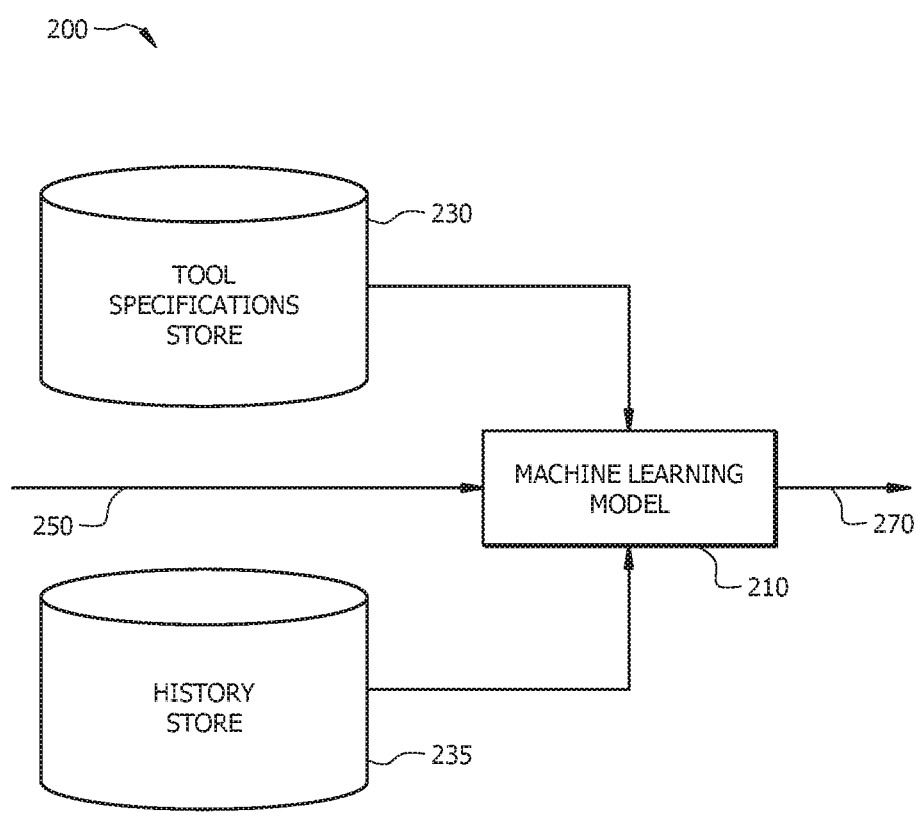
FIG. 2 schematically illustrates a modeling system according to an embodiment.
Figure 3:
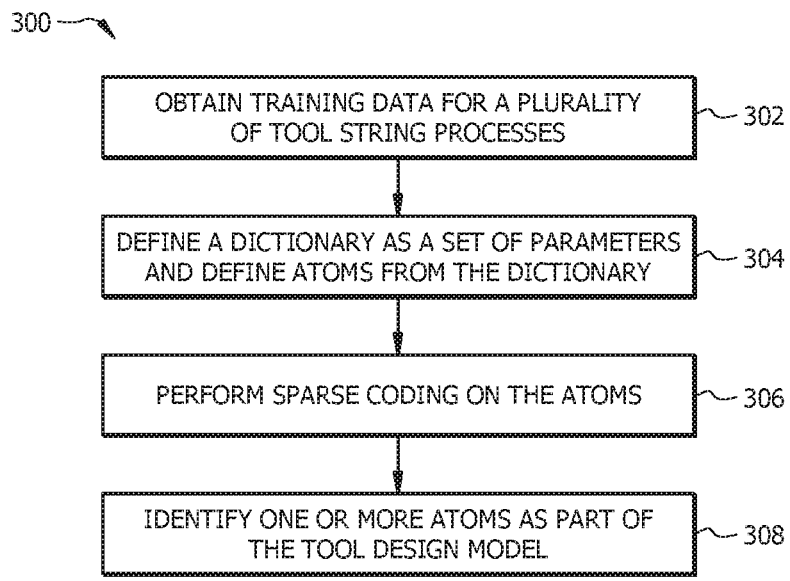
FIG. 3 illustrates a flowchart for a method of developing a tool design model according to an embodiment.

FIG. 2 depicts an exemplary system 200 for providing a tool string design model that can be used as modeling system 185 or FIG. 1. The modeling system 200 can comprise a machine learning model 210 coupled to one or more data stores. The machine learning model 210 can receive inputs 250 and provides output 270 based on the inputs 250 and data retrieved from a history store 235 (e.g., database or repository). Generally, the machine learning model 210 utilizes historical data stored in the history store 235 (e.g., historical information on tool string designs, tool string parameters, operating parameters for the tool string processes, wellbore parameters, formation parameters, etc.) to predictively determine, for instance, one or more tool string designs, operating parameters, and other outputs. Generally, the machine learning model 210 is a learning machine having "artificial intelligence" that utilizes algorithms to learn via inductive inference based on observing data that represents incomplete information about statistical phenomenon and generalize it to rules and make predictions on missing attributes or future data. Further, the machine learning model 210 may perform pattern recognition, in which the adaptive machine learning model 210 "learn" to automatically recognize complex patterns, to distinguish between exemplars based on their different patterns, and to make intelligent predictions. In some embodiments, the machine learning model 210 can perform optimization to narrow down the data used to allow the machine learning model 210 to operate efficiently, even when large amounts of historical training data are present, and/or when complex input parameters are present.

At a high level, the machine learning model 210 may receive inputs 250 comprising constraints and parameters for one or more tool string processes, data from the tool specifications store 230, and data from a history store 235 to perform learning to characterize one or more tool string designs capable of meeting the inputs 250 (e.g., desired outcomes, constraints, etc.). The machine learning model 210 may also, based on the inputs 250 and/or data from the stores 230 and 235, generate outputs indicating tool string designs such as the identification of one or more tools, an order of the tools in the tool string, and/or operating parameters for such tools in performing one or more tool string processes. The machine learning model 210 can comprise any suitable machine learning methods such as artificial neural networks, support vector machines, dictionary learning algorithms, and the like.

The information in the history store 235 and the tool specifications store 230 can be used to train or develop the tool string design model. The illustrated history store 235 includes data for various tool string designs (e.g., tool parameters, tool string parameters, etc.), data for tool string processes performed with the tool string designs (e.g., operating parameters, timing of the processes, costs of the processes, etc.), and various other information such as the wellbore and formation parameters (e.g., wellbore parameters, formation parameters, etc.) measured during historical tool string processes. Thus, the data in the history store 235 can represent actual data from various tool string processes, though other data such as modeled data can also be used in the history store. The data in the history store 235 can be referred to as training data in some contexts, as described in more detail herein. Any other information obtained for a tool string process such as a logging operation in a wellbore can also be included and stored within the history store 235.

The tool parameters can be provided in the history store 235. The tool parameters can comprise various information for the tools including an identification of each tool such as identified by manufacturer, model number, size, and pressure rating, operating characteristics (e.g., voltage, flow rates, sensing capacities, a maximum flow/injection rate profile, etc.) for various types of tools. The tools can comprise any tools used in a wellbore, including any of the tools described herein such as sensors (e.g., logging tools, sampling tools, etc.), isolation devices such as packers, plugs, etc., wash tools, filters, and the like.

The tool string parameters can also be provided in the history store 235. The tool string parameters can comprise information related to the tools within a tool string, including any of those described herein. This can include the types of tools and other components arranged in the tool string, what order the tools and other components are arranged in the tool string, the type of connection between the tools and other components of the tool string, tool, and component weights, whether the tool string is comprised entirely of tubing and tools or whether the string is of the type deployed on line (e.g., wireline, slickline, e-line or other) and, if on line, the characteristics of the line such as the type of line, voltages, capacities, and the like, and other information.

The operating parameters associated with tool processes can be contained in the history store 235. The operating parameters can include any of the settings or conditions for the tools, the wellbore, and/or the formation that are used or detected during a tool string process. In some embodiments, exemplary operating parameters can comprise borehole temperature profile, RIH ("run in hole")/POOH ("pull out of hole") running speed, sampling rates, sampling purities, logging rates, logging parameters, operating voltages, fluid flow rates, operating times (e.g., times to complete the tool string processes, etc.), operating costs, and the like. The operating parameters can comprise fluid characteristics, which can include information about the fluids in the well and the tool string. Some examples can include static characteristics such as fluid type (e.g., gas, liquid, mixture), fluid viscosity, fluid density, pressures inside and out of the tool string and within the well at the surface and (if available) downhole, temperatures at different portions along the length of the well and other information. The fluid characteristics can also include dynamic characteristics such as flow rate, pressures inside and out tool string and within the well, and other information. Any other operating parameter associated with a tool string process can also be included within the data store for the operating parameters.

The history store 235 can also comprise wellbore parameter and formation parameters associated with the wellbore and formation during one or more tool string processes. The wellbore parameters can comprise any data associated with the wellbore 110 in which the tool string process is performed. For example, the wellbore parameters can comprise a borehole diameter, borehole fluid density, wellbore depth, wellbore pressures, wellbore temperatures, wellbore flowrates, type of wellbore (e.g., vertical, deviated, horizontal, etc.), the completion type (e.g., open hole, cased hole, sand screen, etc.), and the like. The formation parameters can comprise any petrophysical information associated with the formation such as a porosity, permeability, rock type (e.g., shale, sandstone, producing layers, non-producing layers, etc.), elemental analysis results, fluid saturation levels (e.g., oil saturation, water saturation, gas saturation, etc.), and the like.

The history store 235 can also comprise one or more outputs and/or constraints measured as part of the tool string processes for historical processes (and/or other data used to train the model). The constraints can represent limits on the desired outputs and/or conditions present in the historical data for the tool string processes. Various types of constraints can include, but are not limited to, sampling rate thresholds, type of samples (e.g., single-phase samples, multi-phase samples, etc.), contamination level threshold(s), pressure testing thresholds, pressure gradients, mobility testing thresholds, type of mobility tests (e.g., steady-state, transient, etc.), fracture testing parameters, injection testing parameters, wireline testing parameters, timing for reaching a desired tool string process result, and costs associated with each tool string process result.

The illustrated tool specification store 230 can include a database of tools or other components that could be used in the tool string, for example, identified by manufacturer, model number, size and pressure rating, correlated to their characteristics. The tool specifications or parameters can be correlated with and represent a catalog of available tools used with the data in the history store 235. The tools characteristics may be retrieved by the machine learning model 210 from the data store 230 based on the inputs 250, for example. The inputs can comprise one or more of the constraints, which can be provided as separate inputs, as a single input, or as a vector or matrix of input values. In some embodiments, the input can be provided as a merit function that can account for a plurality of constraints or results defined for the tool string design, as described in more detail herein.

In a process performed by the machine learning model 210, inputs 250 may be received, for example, from a user or well operator. Such inputs 250 may define, for instance, constraints or parameters for the performance of a tool string process and defined outcomes for defined tool string processes. For example, the inputs may be a time threshold for a fluid sampling process (e.g., obtaining a sample of a given purity in less than a predefined time), a fluid sampling purity, and a fluid sampling volume. Other suitable inputs for one or more tool string processes can be used as inputs to the machine learning model 210. Based on such inputs 250, the machine learning model 210 may execute using the data stored in the history store 235 to identify corresponding patterns within the historical data to determine tool string designs comprising one or more tools capable of performing the tool string processes within the input constraints. The machine learning model 210 may operate to identify tool string designs suitable for performing the tool string processes within the constraints based on processing the historical data. Such results may not result in an exact match with a historical process result, but rather may represent one or more patterns derived from the historical data.

In some embodiments, based on processing the historical data, the machine learning model 210 may provide, through the outputs 270, a tool string design that can comprise information about one or more tools, tool string parameters such as the order of the tools in the tool string, and/or operating parameters for the one or more tools within the tool string. The determined tool string design(s) can satisfy the input constraints. The tool string design(s) can then be used to form a tool string, dispose the tool string in the wellbore, and perform the one or more tool string processes using the determined tool string design.

In some embodiments, the machine learning model 210 can comprise dictionary based learning along with the use of sparse coding. In a dictionary learning model, a statistical analysis of an existing database can be performed to allow the model to summarize the most common patterns in the existing data, and a sparse coding process can then return the optimization results from a quasi-global search of the patterns. The process can be used to reduce the computation load/time significantly compared to other machine learning processes and at the same time return results that can be the same as or better than other methods or current industry standards.

In the dictionary learning and sparse coding process, a dictionary can initially be generated or defined, sparse coding can then be used with the dictionary and/or atoms identified using the dictionary, and the results can then be improved using the sparse coding results to identify one or a few results. The results will comprise one or more atoms that define a list of one or more tools for the tool string, and potentially the order of the tools within the tool string, operating parameters, and the like. As used herein and defined in more detail below, the "dictionary" defines a finite set of parameters and/or parameter combinations or points in the parameter space. Combinations of the parameters representing the common patterns in the data can each be defined as an "atom." As an example, the dictionary can define a set of operating parameters for a tool along with a plurality of tool parameters. An atom can then define a combination of one or more operating parameters for the tool with one or more tool parameters of the plurality of tool parameters. A complete set of parameter combinations based on the defined dictionary parameters can be created to define the set of atoms considered in the sparse coding process. The number of atoms can increase significantly as the number of dictionary parameters increases based on an increasing number of possible combinations, which can make any model operating within the full parameter space difficult to operate due to the large number of combinations within any parameter space.

Sparse coding means that, for a specific job, the system projects its ideal spectrum of functions to the dictionary (instead of a free parameter space) and tries to find a limited number of atoms to represent the ideal spectrum. Improvement or optimization may be accomplished by means of linear or nonlinear optimization including but not limited to genetic algorithms, evolutionary algorithms, forward selection, regression matching, and the like. Optimization takes place with respect to an environment which may be forward simulated multiple times within uncertainty tolerances.

Initially, the dictionary defines the parameter space that can be used to define the output. The dictionary can be used to define atoms that can be used in combination to define an output. For example, the dictionary can comprise atoms that define any of the tool parameters described above such as the types of tools, tool parameters, tool order in the tool string, operating conditions, and the like. The combination of the atoms (e.g., tool parameters with wellbore parameters, etc.) can then define the outcome within a defined space for a specific tool string process. In some embodiments, the atoms can be linearly combined to define the resulting outcome of the process. For example, a resulting atom or set of atoms can be used to define, through a merit function, the resulting outcome of the pre-defined tool string process.

While a number of methods are possible, in some embodiments, a vector can be defined that applies to the dictionary and represents coefficients for each atom in the dictionary needed to obtain a desired output. A coefficient of zero indicates that the resulting parameter is not needed to represent the outcome, and a non-zero coefficient indicates that the atom can be present in the design for the desired outcome. In a large parameter space, a number of solutions can be possible if the full parameter set is considered. This can result in the use of a significant computing resources and/or long optimization times, which can make finding an optimized or improved solution time-consuming.

In order to reduce the computing time, and in some embodiments improve the resulting accuracy of the output, a sparse coding process can be performed on the atoms in the dictionary. In general, sparse coding uses various algorithms to try to represent the atoms in the dictionary in a sparse representation. The sparse representation can find the atom or atoms needed to produce the desired outcome within a threshold of error. For example, the spare coding algorithm is used to first try to represent the parameters in the dictionary in a sparse representation by finding and minimizing the number of atoms needed to represent the defined set of outcomes. During training, the resulting sparse representation (the identified atoms) can then be used to try to reconstruct the original output. The reconstruction can result in a loss or error between the reconstructed data and the original data. When the reconstruction loss is greater than a threshold, the selected atom or atoms can be re-evaluated to try to reduce the reconstruction loss. The process can be repeated until the sparse representation and error converge to an acceptable threshold.

The sparse coding algorithm can be seen as trying to minimize the number of non-zero coefficients in the coefficient vector. The sparse coding algorithm can be balanced by the reconstruction loss. For example, a sparse representation can first be applied to minimize the number of non-zero coefficients in the vector. The resulting outcome can be reconstructed, and an error determined. If the error is above a desired threshold, the constraints on the sparse coding can be relaxed to find a new coefficient vector. The process can be repeated until the selected sparse representation (e.g., a determined coefficient vector) produces an output within a desired error. The resulting sparse representation can comprise one or more atoms that can be used to define the solution.

A tool string design model can be developed using a training process 300 for the tool string design model with the data in the history store 235. In order to determine the sparse representation of the dictionary with regard to the output, historical or training data can be used. For example, historical data for various tool strings can be used, and each specific process can be defined by the tools used, the wellbore parameters and conditions, the tool operating parameters, or any other parameters as described herein that represent the process that is carried out. The resulting output of the process can be also be used within a function (e.g., a merit function, etc.) to define the resulting output or output parameters. The resulting set of input parameters and outputs can be used to perform the sparse coding of the dictionary parameters and/or atoms.

Training data for the model can be obtained from the data in the history store 235 in step 302. In some embodiments, the data used to perform the sparse coding (e.g., the training data) can be obtained from historical procedures and use of tool strings in tool string processes in various wellbores, which can be contained in the history store 235. In some embodiments, specific testing within wellbores can be carried out to create training data used in the sparse coding. For example, when a new tool is developed, there may be a lack of any historical data available for the tool or the tool operating parameters. Specific operations in wellbores can be performed to obtain the dictionary parameters and outputs needed to perform the sparse coding on the dictionary. In some embodiments, the training data can be obtained in a lab or test environment outside of a wellbore. For example, a tool or tool string can be used in a testing environment such as a simulated wellbore using piping and equipment within a laboratory setting to obtain the dictionary parameters along with the process outputs. In some embodiments, one or more tools or tool strings can be simulated in a computer based environment to obtain simulated dictionary parameters and simulated outputs. The simulated data can then be used as part of the training data to perform the sparse coding. Any other suitable methods of obtaining training data having known dictionary parameters along with a determinable output parameter set can be used to perform the sparse coding process.

The training data can also comprise information added based on tool string processes performed over time, which can include information and data obtained based on tool string processes provided by the tool string design model. As new information is collected from tool string processes, the information can be added to the set of training data. The tool string model can then be re-trained using the data collected over time to provide for an improved model.

Using the training data, the dictionary and corresponding atoms can be defined as list of the available parameters within the training data in step 304. The dictionary can comprise the parameters such as any of the tool parameters, tool string parameters, operating parameters, wellbore parameters, formation parameters, or other parameters contained in the history store 235. The set of parameters can define a total parameter space for the data in the history store 235. The resulting parameters in the dictionary can then be used to identify a plurality of atoms, which represent combinations of the parameters contained in the dictionary. A significant number of atoms can be generated based on the parameters within the dictionary.

When dictionary learning is used as the machine learning model, the dictionary can comprise parameters defining the tool(s), tool parameters, tools string parameters, and in some embodiments the tool operating conditions. This allows the dictionary to define the tool parameter space, and in some embodiments, the dictionary can over define the tool parameter space by containing more parameters than are needed to fully define the range of possible parameters for the tool string design. The atoms within the dictionary learning model can then represent a full range of possible combinations of the dictionary elements (e.g., the tool parameters, tool string parameters, operating parameters, etc.). As the number of dictionary entries increases, the number of possible atoms can then increase at a higher rate than the dictionary entries. The use of the sparse coding process can then be used to select only the atoms needed to define or represent the inputs, which can be defined by the merit function.

A sparse coding process can be used with the atoms to identify a sub-set of the total atoms representing a sparse representation of the data in step 306. In some embodiments, the sparse coding process can be performed using a pursuit algorithm such as a matching pursuit (MP) algorithm, an orthogonal matching pursuit (OMP) algorithm, basis pursuit (BP) algorithm, or the like. The selected sparse coding algorithm can be employed to minimize the number of non-zero coefficients in the coefficient matrix while also reducing the error between the actual signal and the reconstructed signal (e.g., the result of the dictionary matrix multiplied by the coefficient vector, etc.) by solving for the coefficient vector that satisfies the constraints. The resulting sparse representation can result in a defined coefficient vector that can then be used in the process to identify the sparse representation of the dictionary parameters to define a trained model in step 308. The identified sparse repetition can comprise one or more atoms used to represent the training data, and the sparse representation can then be used with input data in the form of constraints and parameters to identify one or more atoms that best represent the input data.

In use, the resulting trained model can be used with the sparse representation to define one or more atoms that can be used in combination to provide a desired output based on a set of inputs such as constraints and conditions for a tool string process. For example, a desired set of inputs such as a definition of the tool string process and constraints or conditions for the tool string process can be provided to the trained model, and one or more atoms can be identified as the output to represent the closest result (e.g., improved or optimized result) for obtaining the input parameters. In some embodiments, the inputs used with the trained model can comprise one or more constraints or requirements for a particular tool string process. The inputs to the model can comprise any of the constraints or requirements as contained in the history store 235. For example, the inputs to the tool design model can comprise various parameters such as sampling rate thresholds, type of samples (e.g., single-phase samples, multi-phase samples, etc.), contamination level threshold(s), pressure testing thresholds, pressure gradients, mobility testing thresholds, type of mobility tests (e.g., steady-state, transient, etc.), fracture testing parameters, injection testing parameters, wireline testing parameters, timing for reaching a desired tool string process result, costs associated with each tool string process result, safety procedures or requirements, and the like.

In order to input the values into the tool design model, a functional representation of the inputs can be developed, which can refer to a merit function for the tool string process. The merit function comprises one or more defined objectives for performing a process in a wellbore that can comprise a combination of one or more values such as desired results, results within constraints, or the like. For example, the merit function can define thresholds for one or more of the tool string designs, operating parameters, formation parameters, timings, costs, and the like. The merit function can be a single value or represent a vector or matrix. For example, the merit function can comprise a vector defining values for one or more required parameters or thresholds within a defined list of tool string process constraints. In some embodiments, the merit function can represent a mathematical conversion of the one or more constraints to provide an input value, vector, or matrix to the tool design model. The tool design model can then determine a tool string design that satisfies the merit function using the atoms obtained based on the dictionary. The identified atom(s) can then represent the best tool string design to satisfy the merit function.

The one or more atoms provided an output of the trained model can define a tool string design, operating parameters, and/or tool string design parameters for the tool string design. At a high level, this process can be seen as using the sparse coding algorithm with a defined parameter space to identify the patterns in the dictionary that most affect the outcomes. The identified patterns can then be used to provide the solution for a desired output.

In some embodiments, a method of developing a tool string design model can be provided. The machine learning methods as described herein can be used to develop a tool string design model. In this process, a tool string design model can be created to accept a defined merit function or output definition and provide a tool string design as an output. The tool string design can then be used to form a tool string, which can then be disposed in a wellbore to perform a tool string process. For example, the tool string design can comprise one or more sensors or test apparatuses that can be configured in a specific order and conveyed into a wellbore. Once in the wellbore, the testing procedures can be used at one or more depths to perform the tool string process.

In some embodiments, a process for designing a tool string design model can comprise creating a machine learning model. The machine learning model can comprise any suitable model that can be trained using training data as described herein to produce a tool string configuration or design. In some embodiments, the machine learning model can use one or more algorithms such as a sparse coding algorithm, a forward evaluation algorithm, neural networks, Bayesian networks, or the like. Training data can then be used with the selected model to train the model. The training can comprise determining one or more coefficients or weights used within the model to minimize an error between the input parameters and the output parameters. The training data can comprise a data set defining one or more input parameters such as tool parameters, tool string parameters, wellbore parameters, formation parameters, operating parameters, and the like. The training data can also comprise the corresponding output parameters, which can be combined or modified using one or more merit functions to define an output. The resulting training data can then establish the machine learning model parameters so that the model can be used to identify a tool string design when a desired output or merit function is pre-defined.

In some embodiments, the machine learning model can comprise the use of dictionary learning with sparse coding processes. A method of creating a tool string design model using dictionary learning can begin with defining a dictionary, which can comprise a plurality of modeling parameters. In some embodiments, the modeling parameters can comprise tool parameters, tool string parameters, wellbore parameters, operating parameters, and combinations thereof. Atoms can then be generated and defined based on the dictionary parameter to represent combinations of the dictionary parameters.

Once the dictionary and the corresponding set of atoms are defined, sparse coding can be used to identify a sparse representation of the atoms. Any suitable algorithm can be used to perform the sparse coding process. The sparse coding process can serve to identify one or more atoms (e.g., a set of atoms) suitable for representing the data in a compact fashion. The sparse coding can be performed to identify a sparse representation (e.g., a minimal set of atoms) of the atoms that are capable of reconstructing the data within an acceptable error threshold. In some embodiments, a pursuit algorithm such a matching pursuit (MP) algorithm, an orthogonal matching pursuit (OMP) algorithm, basis pursuit (BP) algorithm, or the like can be used to perform the sparse coding.

The sparse coding process can begin with the entire set of atoms (e.g., prototype atoms) and use the pursuit algorithm to reduce the entire set of atoms to a reduced or minimal set that can be used to represent the training data. The training data can include any of the training data described herein. In general, the training data can comprise information for known tool designs and processes that can be used to identify the dictionary parameters and the corresponding atom values. The sparse coding can be used with the known information to reconstruct the known outputs (e.g., the results of a merit function) based on the results of the tool string processes. The sparse coding process can be iterative in some embodiments. The process can be performed until a sparse representation is obtained that is capable of reconstructing the results from the training data within an acceptable margin of error.

The result of the sparse coding process can be an identification of a set of atoms (e.g., one or more atoms) representing combinations of the tool and tool string parameters in the dictionary that can be used to provide the corresponding output. For a tool string design, the input can be defined by a merit function that can comprise a combination of one or more input values such as desired results, results within constraints, or the like. The merit function can be a single value or represent a vector or matrix. The sparse coding can then represent a set of combinations of tool parameters, tool string parameters, and operating parameters that can be used to represent an identified range of input values defined by the merit function, such as wellbore parameters, formation parameters, process requirements, process constraints, and the like. The set of combinations can be a relatively small portion of the total set of combinations provided by the original set of atoms. Thus, the sparse representation can allow for a reduced computation load and processing time to determine a tool string design relative to trying to optimize the design using the entire set of parameters in the dictionary, the entire set of atoms, and/or optimization algorithms used in other machine learning techniques.

For a tool design model using dictionary learning and sparse coding, the dictionary and corresponding set of atoms can be improved over time using machine learning. This process can comprise adjusting the prototype atoms in the dictionary, such that the prototype atoms are more representative of the common patterns as a starting point for the sparse coding process. As described herein, dictionary machine learning can be performed with data in a database (e.g., the history store 235) accumulated from previous tool string processes. Machine learning can be used to help identify and limit the prototype atoms in the dictionary to significantly decrease the number of prototype atoms while retaining the performance and accuracy of the model. This allows the computation load during the sparse coding process (e.g., the optimization search) to be further decreased.

As part of the training process, the dictionary itself can be updated. In this process, a function can be defined between the available dictionary, and therefore the atoms defining the parameters combinations, and a residual error obtainable from the sparse coding process. An overall optimization process can be performed to modify the dictionary to find those parameters that can minimize the error in the resulting sparse coding reconstruction of the data while also reducing the size of the dictionary. Various methods such as a maximum likelihood method, a method of optimal directions, a maximum a posterior probability method, and the like can be used to modify the dictionary.

In these methods, a dictionary of available parameters can be defined, and sparse coding can be performed on the entire parameter space. Once the sparse representation is obtained, a second optimization process as described above can be performed on the dictionary using the sparse representation. The dictionary optimization seeks to minimize the errors obtained by applying the sparse representations to the dictionary and finding the difference from the known results. At a high level, this can be seen as removing parameters from the dictionary that do not affect the results and/or do not affect the results above a threshold error level. The dictionary parameters not affecting the outcome of the model can then be removed from the dictionary, thereby reducing the total number of parameters and corresponding atoms that are used in the sparse coding process. As an example, the atoms in the identified sparse representation can be examined to identify the dictionary parameters present in the selected sub-set of atoms. Any dictionary parameter not present in any atoms in the sparse representation may be removed from the dictionary. The set of available atoms can then be updated, and the sparse coding process can then be repeated with the new set of prototype atoms.

Once the dictionary is updated, the sparse coding process can be repeated to refine the sparse representation. The resulting refined sparse representation can then be used to re-evaluate the dictionary parameters in an iterative process that switches between the dictionary optimization and the sparse coding processes. The process can then converge to a result having an improved dictionary with a reduced set of parameters, which can then allow the sparse coding to be performed faster. The overall result of the dictionary optimization can be to identify those parameters that affect the outcome of the tool string processes while significantly improving the time to obtain the sparse representation of the dictionary parameters. In some embodiments, the dictionary optimization can be performed without losing accuracy in the sparse representation or model output results.

Figure 4:
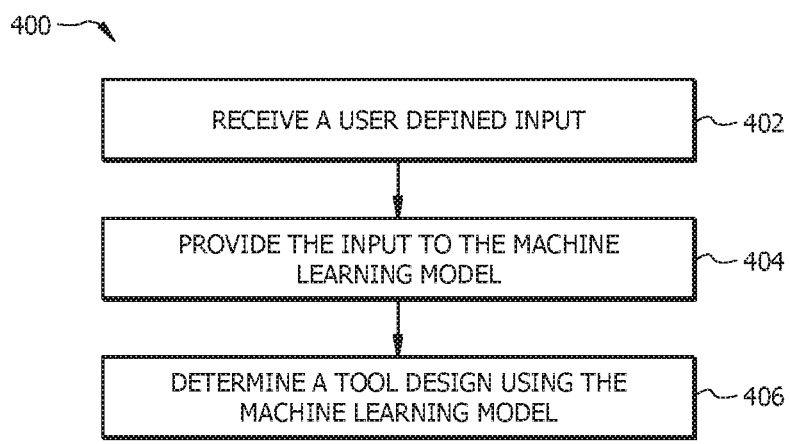
FIG. 4 illustrates a flowchart for a method for designing a tool string according to an embodiment.

Once the tool design model is developed or trained, and optionally optimized using the dictionary training, the tool design model can be used to design a tool string for use in a wellbore, as shown in the flowchart of FIG. 4. In this method 400, a user-defined input can be received in step 402. In some embodiments, the user-defined input can be a merit function determined for a particular design of a tool string. The merit function can comprise any of the merit functions as defined here. For example, the merit function can be defined by one or more constraints or parameters such as wellbore parameters, formation parameters, process requirements, process constraints, or the like. The defined merit function can then be provided to a machine learning model such as the tool design model in step 404. A tool string design for a tool string can then be determined using the tool design model and the merit function at step 406. As described herein, the tool design model can be operated on a computing system. The tool string design as determined from the tool design model can comprise an indication of one or more tools used to form a tool string for performing a tool string process in the wellbore. The tool string design provided by the tool string design model can satisfy the merit function provided as an input into the tool string design model.

Once designed, the tool string design can be used to form a tool string by combining the one or more tools that can be conveyed into the wellbore. The tool string design provided by the tool string model can comprise tool parameters such as the type of tool, a specific tool design or model, or any of the other tool parameters as described herein. The tool string design can comprise tool string parameters such as an order of the tools in the tool string, a spacing of the tools, or any of the other tool string parameters described herein. The tool string design can comprise one or more operating parameters such as operating voltages, sampling rates, sampling volumes, sampling times, or any other operating parameters described herein. The tool string can be combined according to the tool string design to provide a tool string suitable for performing a tool string process within the wellbore within the identified tool string design parameters.

Once formed, the tool string can be disposed in a wellbore to perform a tool string process such as a testing procedure, a workover procedure, or any of the other tool string processes described herein. In some embodiments, the tool string design can indicate the need for two or more tool string designs. Such a tool string design can indicate that multiple tool string configurations may be needed in subsequent tool string processes. In these embodiments, a first tool string can be formed using a first tool string design. The first tool string can be disposed in the wellbore to perform a first tool string process. Once complete, the first tool string can be removed from the wellbore, and a second tool string can be formed using a second tool string design. In some embodiments, the second tool string design can be used to perform a second tool string process within the wellbore.

As an example, the tool string design model may indicate that in order to perform an overall tool string process comprising both a formation logging procedure and a production test, two separate tool designs may be needed to achieve the merit function defined by the requirements of the overall tool string process. Such a design may indicate that a first tool string design comprising one or more sensors or logging tools may be needed for the formation logging procedure, and a second tool string design may be needed for the production test. In this example, the tool string design provided by the tool design model may also indicate an order in which the first tool string design and the second tool string design should be used within the wellbore. The tool strings can then be used in a first tool string process (e.g., the formation logging procedure) followed by removing one tool string design and disposing the second tool string design into the wellbore to perform the second tool string operation (e.g., the production test).

Depending on the available information for the wellbore to allow the merit function to be defined, a multi-tool string process can be performed by re-evaluating the tool string design with the tool string design model between one or more tool string processes. The ability to re-evaluate the tool string design can be based on obtaining different or improved information or parameters between the tool string processes. For example, the wellbore parameters and formation parameters may be used as part of the merit function. When a first tool string process allows for wellbore parameters or formation parameters to be obtained that were not available at the time of the first tool string process, or allows for improved measurements of the wellbore parameters or formation parameters to be obtained, the additional information can be used with the tool string design model to re-evaluate the tool string design between a first tool string process and a second tool string process. The improved information may result in a modified tool string design that can then be used to perform a second or subsequent tool string operation.

In some embodiments, the tool string design model can use dictionary learning with sparse coding. In this embodiment, the tool string design model can be developed as described herein using a defined dictionary along with sparse coding to identify a set of atoms that can be used to provide a tool string design for a defined merit function. Once the tool string model is trained and the sparse representation of the atoms is obtained, the tool string model can be used with a merit function to identify one or more atoms. In some embodiments, a single atom may be defined by the model for a given merit function. The atom can represent a combination of one or more tool parameters (e.g., an identification of a tool, a tool model, etc.), tool string parameters, and/or operating parameters. The information defined by the atom (e.g., the combination of parameters) can then be used to define the tool string design. The single atom can identify one or more tools that can be used in the tool string design, and the resulting tool string can be used in a single tool string process within the wellbore.

In some embodiments, two or more atoms can be identified by the tool string model. Within a dictionary learning model, the atoms can be used to form linear combinations to represent the merit function. The identification of two or more atoms can represent a combination of tool string designs used to meet the defined merit function. The resulting combination can be representative of a tool string design in which a first set of one or more tools can be disposed at a first point in a tool string and a second set of one or more tools can be disposed above or below the first set of the one or more tool strings in the overall tools string. The first set of the one or more tools can be conveyed to a desired depth along the wellbore to perform a first tool string process followed by conveying the second set of one or more tools to the desired depth along the wellbore to perform a second tool string process. For example, a first set of tools can be conveyed to a desired depth, and then the entire tool string can be raised or lowered to position the second set of tools at the desired depth to perform a second and subsequent process, all without removing the entire tool string from the wellbore.

In some embodiments, the identification of two or more atoms can indicate that two sets of tools string designs can be used to perform the processes defined by the merit function. The two designs can represent designs used with a first tool string design and a second tool string design. The first tool string design can be used to form a first tool string that can be conveyed to a desired location within the wellbore to perform a first tool string process. The entire tool string can then be removed from the wellbore. A second tool string design can be used to form a second tool string, which can then be disposed in the wellbore and conveyed to the desired depth to perform a second tool string process. In this embodiment, the identification of two or more atoms by the tool string design model can represent the need for separate tool strings used in different tool string runs within the wellbore.

When separate tool string designs are used in subsequent tool string runs within the wellbore, the tool string design model using the dictionary learning and sparse coding can be used to re-evaluate the tool string design between subsequent tool string processes within the wellbore. For example, the merit function can be re-defined after a tool string process using information obtained in an earlier tool string process. The tool string model can then provide a new tool string design, that can be the same as or different than the initial tool string design for a second or subsequent tool string process. The ability to re-evaluate the tool string design using the tool string design model can be based on the use of the dictionary learning and sparse coding, which can reduce the computing times necessary for such re-evaluations. Specifically, the use of the dictionary learning with sparse coding can reduce the evaluation times to be on par with the required conveyance times associated with a wellbore, such that the re-evaluation can be performed in a time frame that allow a new tool string design to be determined without slowing down the tool string processes within the wellbore. Such a re-evaluation may not be possible when the entire parameter space is used or when other types of optimizations are performed due to the time required to reach an optimization in the results.

In some embodiments, the method described herein can be used to determine the design for one or more tools. As an example, the machine learning methods described herein can be used in a method for designing an optical element for use in a wellbore. Optical elements can be used in various tools such as analyzers, sensors, and the like. In some embodiments, an optical elements can have a number of characteristics such as an optical spectrum such as a transmission spectrum (e.g., vs wavelength) and/or a reflectance spectrum (with distribution depending on the angle/orientation), optical scattering, a polarization state, luminescence, radiation, Raman characteristics, and the like. As an example, the optical characteristics can include a transmission spectrum, which can be based on the thicknesses of thin film layers on the surface of the optical elements. In a process for determining an optical element design, the method can comprise receiving a merit function that comprises one or more defined optical characteristics for an optical element for use in a wellbore, and determining, with a computing system and based on the merit function, an optical element design, wherein the tool string design satisfies the merit function.

In some embodiments, the optical characteristics of the optical element can be defined by a number of thicknesses of the thin films. For example, a dictionary of optical spectra (e.g., a transmission spectra) can be generated by assigning a defined parameter to each layer such as assigning a thickness corresponding to a thin, medium-thin, medium-thick, and thick layer. While four values are provided, any number of thickness values can be used in the dictionary. When combined with two or more layers (m dimensional where m is the number of layers), an exhaustive combination of these thicknesses for all the layers (e.g., combinations across a n4, n to the 4th power, parameter space) can include approximately all the possible spectral shapes that the transmission of an n-layer filter can have. Thus, the n-layer dictionary can be defined by the parameter set across the n4 space, and the combinations across the thicknesses for all of the layers represents the atoms defined by the dictionary.

Dictionary learning using sparse coding can then be performed on the optical element dictionary and atoms. Once the model is trained, the model can be used with a desired spectral shape to identify the corresponding thicknesses of each layer of the thin films. This can allow an optical element design to be obtained in an efficient manner in a short amount of time. For example, an optimized optical element design having optimized thin film thicknesses can be obtained for a desired optical spectrum using this method. Alternatively, the spectral shape of the transmission spectrum can be obtained knowing the relative thicknesses of each layer. Once designed, the optical element can be provided (e.g., obtained, built, manufactured, selected from a plurality of optical elements, etc.) and used within a tool processes.

While described in terms of a tool process, the optical element design can be used in both wellbore and non-wellbore environments. For example, the optical element design can be used for optical elements in testing equipment, sensors, and various other equipment used in laboratories and processing equipment at the surface or even not associated with a wellbore environment. Thus, the method for providing an optical element design can have wide applicability for providing optical elements with one or more optimized or improved parameters.

Figure 5:
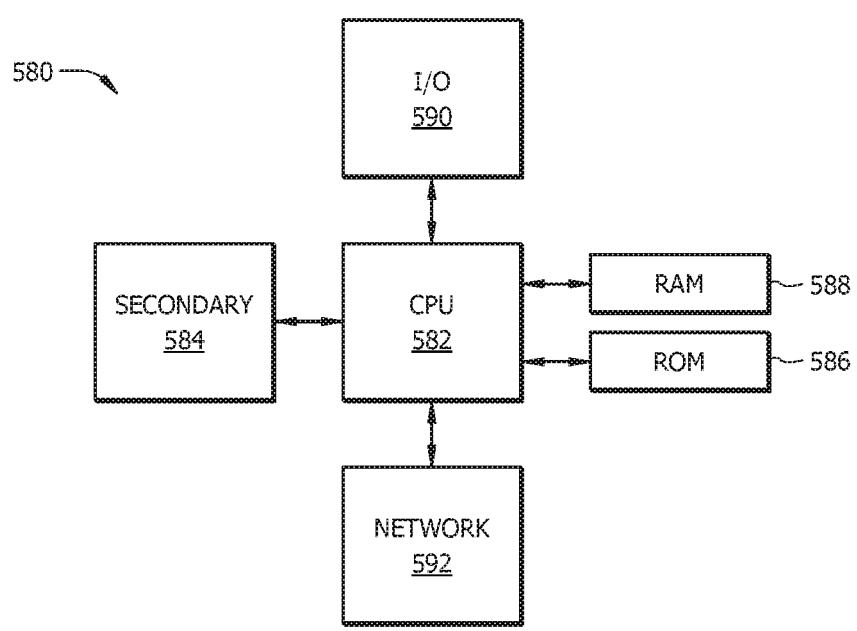
FIG. 5 schematically illustrates a computing environment according to an embodiment.

Any of the systems and methods disclosed herein can be carried out on a computer or other device comprising a processor (e.g., a desktop computer, a laptop computer, a tablet, a server, a smartphone, or some combination thereof), such as the server system 165 or the clients 155 of FIG. 1. In addition to the description with respect to FIG. 1, the computing systems are described in more detail with respect to FIG. 5. As shown, FIG. 5 illustrates a computer system 580 suitable for implementing one or more embodiments disclosed herein such as the server system or any portion thereof that can be used to execute the modeling system 185. The computer system 580 includes a processor 582 (which may be referred to as a central processor unit or CPU) that is in communication with memory devices including secondary storage 584, read-only memory (ROM) 586, random access memory (RAM) 588, input/output (I/O) devices 590, and network connectivity devices 592. The processor 582 may be implemented as one or more CPU chips.

It is understood that by programming and/or loading executable instructions onto the computer system 580, at least one of the CPU 582, the RAM 588, and the ROM 586 are changed, transforming the computer system 580 in part into a particular machine or apparatus having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

Additionally, after the system 580 is turned on or booted, the CPU 582 may execute a computer program or application. For example, the CPU 582 may execute software or firmware stored in the ROM 586 or stored in the RAM 588. In some cases, on boot and/or when the application is initiated, the CPU 582 may copy the application or portions of the application from the secondary storage 584 to the RAM 588 or to memory space within the CPU 582 itself, and the CPU 582 may then execute instructions of which the application is comprised. In some cases, the CPU 582 may copy the application or portions of the application from memory accessed via the network connectivity devices 592 or via the I/O devices 590 to the RAM 588 or to memory space within the CPU 582, and the CPU 582 may then execute instructions of which the application is comprised. During execution, an application may load instructions into the CPU 582, for example load some of the instructions of the application into a cache of the CPU 582. In some contexts, an application that is executed may be said to configure the CPU 582 to do something, e.g., to configure the CPU 582 to perform the function or functions promoted by the subject application. When the CPU 582 is configured in this way by the application, the CPU 582 becomes a specific purpose computer or a specific purpose machine.

The secondary storage 584 is typically comprised of one or more disk drives or tape drives and is used for non-volatile storage of data and as an over-flow data storage device if RAM 588 is not large enough to hold all working data. Secondary storage 584 may be used to store programs which are loaded into RAM 588 when such programs are selected for execution. The ROM 586 is used to store instructions and perhaps data which are read during program execution. ROM 586 is a non-volatile memory device which typically has a small memory capacity relative to the larger memory capacity of secondary storage 584. The RAM 588 is used to store volatile data and perhaps to store instructions. Access to both ROM 586 and RAM 588 is typically faster than to secondary storage 584. The secondary storage 584, the RAM 588, and/or the ROM 586 may be referred to in some contexts as computer-readable storage media and/or non-transitory computer-readable media.

I/O devices 590 may include printers, video monitors, electronic displays (e.g., liquid crystal displays (LCDs), plasma displays, organic light-emitting diode displays (OLED), touch-sensitive displays, etc.), keyboards, keypads, switches, dials, mice, trackballs, voice recognizers, card readers, paper tape readers, or other well-known input devices.

The network connectivity devices 592 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards that promote radio communications using protocols such as code division multiple access (CDMA), global system for mobile communications (GSM), long-term evolution (LTE), worldwide interoperability for microwave access (WiMAX), near field communications (NFC), radio frequency identity (RFID), and/or other air interface protocol radio transceiver cards, and other well-known network devices. These network connectivity devices 592 may enable the processor 582 to communicate with the Internet or one or more intranets. With such a network connection, it is contemplated that the processor 582 might receive information from the network, or might output information to the network (e.g., to an event database) in the course of performing the above-described method steps. Such information, which is often represented as a sequence of instructions to be executed using processor 582, may be received from and outputted to the network, for example, in the form of a computer data signal embodied in a carrier wave.

Such information, which may include data or instructions to be executed using processor 582 for example, may be received from and outputted to the network, for example, in the form of a computer data baseband signal or signal embodied in a carrier wave. The baseband signal or signal embedded in the carrier wave, or other types of signals currently used or hereafter developed, may be generated according to several known methods. The baseband signal and/or signal embedded in the carrier wave may be referred to in some contexts as a transitory signal.

The processor 582 executes instructions, codes, computer programs, scripts which it accesses from hard disk, floppy disk, optical disk (these various disk based systems may all be considered secondary storage 584), flash drive, ROM 586, RAM 588, or the network connectivity devices 592. While only one processor 582 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 584, for example, hard drives, floppy disks, optical disks, and/or other device, the ROM 586, and/or the RAM 588 may be referred to in some contexts as non-transitory instructions and/or non-transitory information.

In an embodiment, the computer system 580 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 580 to provide the functionality of a number of servers that is not directly bound to the number of computers in the computer system 580. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer-readable storage medium having computer-usable program code embodied therein to implement the functionality disclosed above. The computer program product may comprise data structures, executable instructions, and other computer usable program code. The computer program product may be embodied in removable computer storage media and/or non-removable computer storage media. The removable computer-readable storage medium may comprise, without limitation, a paper tape, a magnetic tape, magnetic disk, an optical disk, a solid-state memory chip, for example, analog magnetic tape, compact disk read-only memory (CD-ROM) disks, floppy disks, jump drives, digital cards, multimedia cards, and others. The computer program product may be suitable for loading, by the computer system 580, at least portions of the contents of the computer program product to the secondary storage 584, to the ROM 586, to the RAM 588, and/or to other non-volatile memory and volatile memory of the computer system 580. The processor 582 may process the executable instructions and/or data structures in part by directly accessing the computer program product, for example by reading from a CD-ROM disk inserted into a disk drive peripheral of the computer system 580. Alternatively, the processor 582 may process the executable instructions and/or data structures by remotely accessing the computer program product, for example by downloading the executable instructions and/or data structures from a remote server through the network connectivity devices 592. The computer program product may comprise instructions that promote the loading and/or copying of data, data structures, files, and/or executable instructions to the secondary storage 584, to the ROM 586, to the RAM 588, and/or to other non-volatile memory and volatile memory of the computer system 580.

In some contexts, the secondary storage 584, the ROM 586, and the RAM 588 may be referred to as a non-transitory computer-readable medium or a computer-readable storage media. A dynamic RAM embodiment of the RAM 588, likewise, may be referred to as a non-transitory computer-readable medium in that while the dynamic RAM receives electrical power and is operated in accordance with its design, for example during a period of time during which the computer system 580 is turned on and operational, the dynamic RAM stores information that is written to it. Similarly, the processor 582 may comprise an internal RAM, an internal ROM, a cache memory, and/or other internal non-transitory storage blocks, sections, or components that may be referred to in some contexts as non-transitory computer-readable media or computer-readable storage media.

EXAMPLES

The embodiments having been generally described, the following examples are given as particular embodiments of the disclosure and to demonstrate the practice and advantages thereof. It is understood that the examples are given by way of illustration and are not intended to limit the specification or the claims in any manner.

Example 1

In order to demonstrate the feasibility of using a design model using dictionary learning and sparse coding, an example for the optimization of the parameters of a sensor were performed. In this example, the design of an optical filter that contains a number of thin film layers whose thicknesses are to be optimized was performed in order to achieve an ideal transmission spectrum (vs. wavelength).

The conventional method, which is also the current industrial standard used by optical device manufacturers and design software vendors, is based on a random sampling inside the thickness space (n dimensional where n is the number of layers) followed by a local optimization. In this example, a dictionary of transmission spectra was generated by assigning to each layer four thicknesses corresponding to a thin, medium-thin, medium-thick, and thick layer. When combined with two or more layers (m dimensional where m is the number of layers), an exhaustive combination of these four thicknesses for all the layers (e.g., combinations across a $n^4$, n to the $4^{th}$ power, parameter space) included approximately all the possible spectral shapes that the transmission of an n-layer filter can have. Thus, the n-layer dictionary in this example was defined by the parameter set across the $n^4$ space, and the combinations across the thickness for all of the layers represents the atoms defined by the dictionary.

Figure 6:
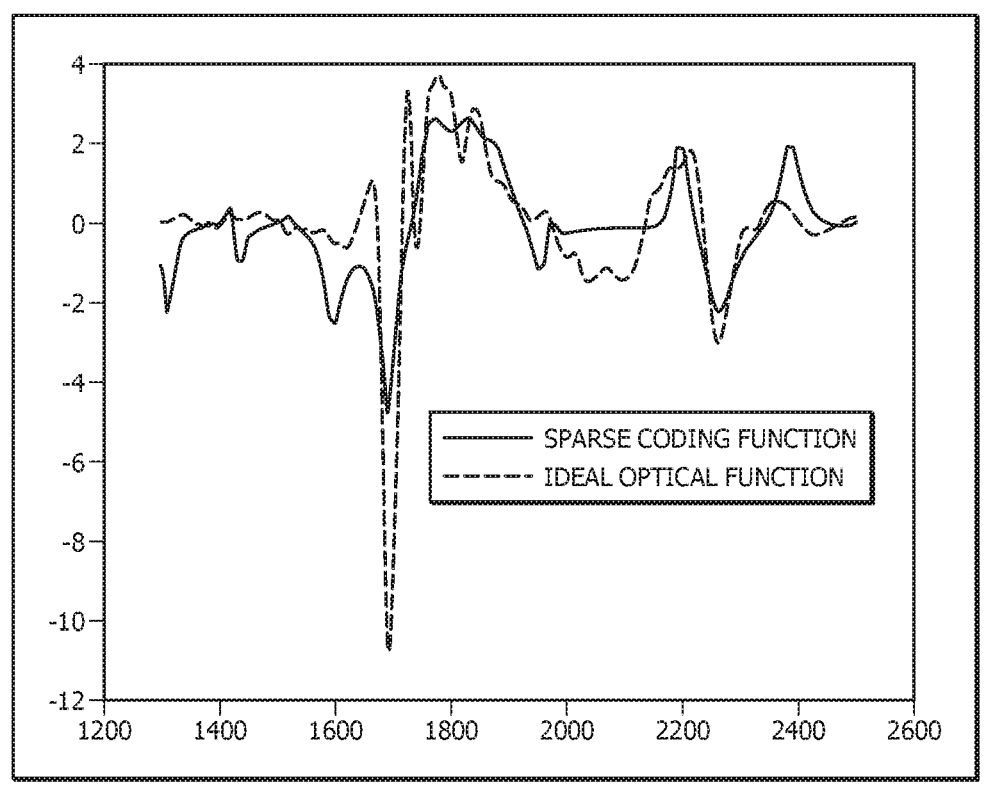
FIG. 6 illustrates a spectral curve for an optical function as described in Example 1.
Figure 7:
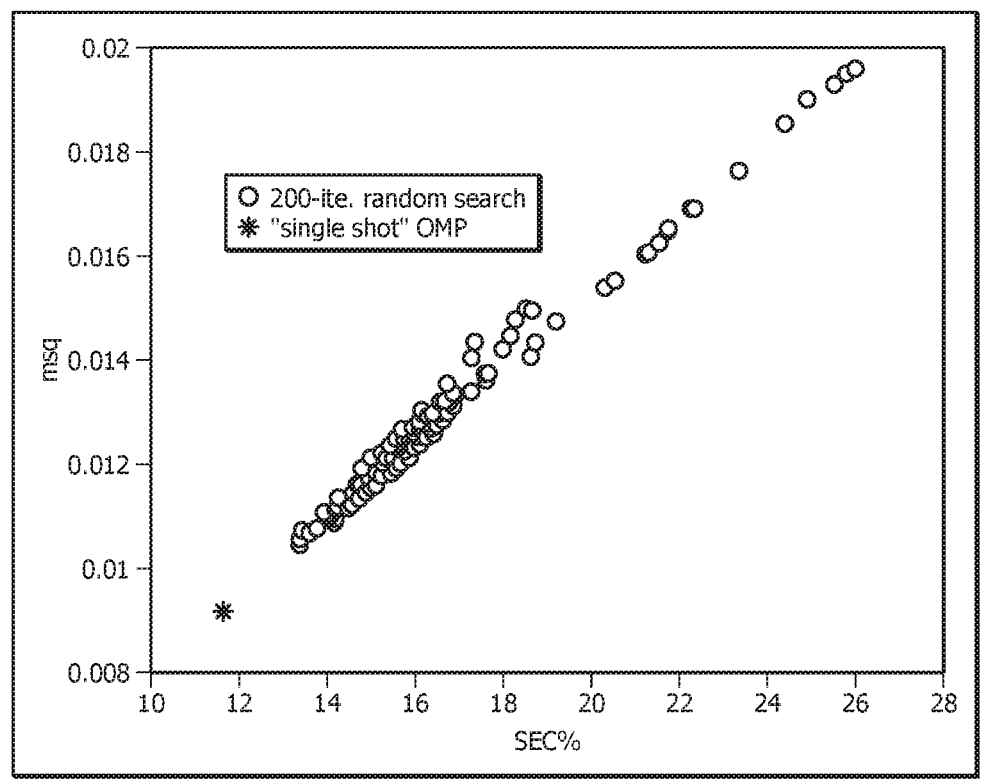
FIG. 7 illustrates performance parameters for the modeled results as described in Example 1.

For a specific analysis job, an ideal optical function has the spectral shape of the blue curve of FIG. 1. This shape was to be approximated by the linear combination of two physical filters whose layer thicknesses were to be optimized. In FIG. 6, the conventional method with 200-iteration (random sampling+local optimization) was compared to the new method of as described herein. In FIG. 7, x and y axes are different performance parameters: the smaller the better for both. It can be seen that the result of the new method is significantly better than the conventional process. Moreover, a 200-iteration conventional search took a lab computer about half a day, whereas the "single shot" OMP and local optimization (OMP is the sparse coding algorithm) took the same computer only 5 minutes. FIGS. 6 and 7 are based on an analysis in the near IR range. A similar comparison study for another analysis in the mid-IR range, using different sets of filter materials and substrates, resulting in the observation that the method of as described herein performed better than a 2000-iteration conventional search while using only ~0.1% of the time.

Having described various systems and methods herein, certain aspects can include, but are not limited to:

In a first embodiment, a method for designing a tool string for use in a wellbore comprises: receiving a merit function, wherein the merit function comprises one or more defined objectives for performing a process in a wellbore; determining, with a computing system and based on the merit function, a tool string design for a tool string, wherein the tool string design comprises an indication of one or more tools used to form a tool string for performing the process in the wellbore, and wherein the tool string design satisfies the merit function.

A second embodiment can include the method of the first embodiment, further comprising;
  receiving one or more system constraints, wherein determining the tool string design is further based on the one or more system constraints, and wherein the tool string design satisfies the merit function and the one or more system constraints.

A third embodiment can include the method of the first or second embodiment, wherein the tool string design further comprises an ordering of the one or more tools in the tool string.

A fourth embodiment can include the method of any one of the first to third embodiments, wherein the tool string design comprises: a first tool string design for a first tool string, wherein the first tool string is used to perform a first process in the wellbore; and a second tool string design for a second tool string, wherein the second tool string is used to perform a second process in the wellbore, wherein the second process is performed after the first process.

A fifth embodiment can include the method of the fourth embodiment, wherein the first tool string is removed from the wellbore between the first process and the second process.

A sixth embodiment can include the method of any one of the first to fifth embodiments, wherein determining the tool string design comprises using a machine learning model on the computing system to determine the tool string design.

A seventh embodiment can include the method of the sixth embodiment, wherein the machine learning model comprises a sparse coding process.

An eighth embodiment can include the method of the seventh embodiment, wherein the sparse coding process comprises a matching pursuit (MP) algorithm, an orthogonal matching pursuit (OMP) algorithm, or a basis pursuit (BP) algorithm.

A ninth embodiment can include the method of any one of the first to eighth embodiments, wherein the merit function comprises a predefined set of thresholds or values for one or more process criteria.

A tenth embodiment can include the method of any one of the first to ninth embodiments, wherein the one or more tools comprise: a carrier, a gauge carrier, a gauge, a recorder, a port, a slot, a carrier gun, a piston assembly, a valve, a bypass valve, a valve assembly, a shut-in valve, a circulation valve, a reverse circulation valve, a safety valve, a drain valve, a drill stem testing tool, a nozzle, a packer, a safety joint, a sample container, a perforating gun, a perforated pipe, a shoe, a sampling tool, a logging tool, a drill stem testing tool, a fracturing tool, a drilling tool, a completion tool, a perforating tool, a repair tool, a work over tool, or any components thereof.

In an eleventh embodiment, a system for determining a tool string design comprises: a processor; a memory, wherein the memory comprises a machine learning model, and wherein the machine learning model, when executed on the processor, configures the processor to: receive a merit function, wherein the merit function comprises one or more defined objectives for performing a process in a wellbore; and determine, based on the merit function, a tool string design for a tool string, wherein the tool string design comprises an indication of one or more tools used to form a tool string for performing the process in the wellbore, and wherein the tool string design satisfies the merit function.

A twelfth embodiment can include the system of the eleventh embodiment, wherein the processor is further configured to: receive one or more system constraints, wherein the determination of the tool string design is further based on the one or more system constraints, and wherein the tool string design satisfies the merit function and the one or more system constraints.

A thirteenth embodiment can include the system of the eleventh or twelfth embodiment, wherein the tool string design further comprises an ordering of the one or more tools in the tool string.

A fourteenth embodiment can include the system of any one of the eleventh to thirteenth embodiments, wherein the tool string design comprises: a first tool string design for a first tool string, wherein the first tool string is configured to perform a first process in the wellbore; and a second tool string design for a second tool string, wherein the second tool string is configured to perform a second process in the wellbore.

A fifteenth embodiment can include the system of any one of the eleventh to fourteenth embodiments, wherein the machine learning model comprises a dictionary learning model used with sparse coding.

A sixteenth embodiment can include the system of the fifteenth embodiment, wherein the sparse coding process comprises a matching pursuit (MP) algorithm, an orthogonal matching pursuit (OMP) algorithm, or a basis pursuit (BP) algorithm.

A seventeenth embodiment can include the system of any one of the eleventh to sixteenth embodiments, wherein the merit function comprises a predefined set of thresholds or values for one or more process criteria.

An eighteenth embodiment can include the system of any one of the eleventh to seventeenth embodiments, wherein the one or more tools comprise: a carrier, a gauge carrier, a gauge, a recorder, a port, a slot, a carrier gun, a piston assembly, a valve, a bypass valve, a valve assembly, a shut-in valve, a circulation valve, a reverse circulation valve, a safety valve, a drain valve, a drill stem testing tool, a nozzle, a packer, a safety joint, a sample container, a perforating gun, a perforated pipe, a shoe, a sampling tool, a logging tool, a drill stem testing tool, a fracturing tool, a drilling tool, a completion tool, a perforating tool, a repair tool, a work over tool, or any components thereof.

In a nineteenth embodiment, a method for designing a tool string for use in a wellbore comprises: receiving a merit function, wherein the merit function comprises one or more defined objectives for performing a tool string process in a wellbore; determining, using a dictionary learning algorithm with sparse coding, one or more atoms based on the merit function, wherein the dictionary learning algorithm uses a dictionary of parameters, wherein a plurality of atoms are defined by combinations of parameters from the dictionary, and wherein the one or more atoms represent a sparse representation of the dictionary of parameters; and determining a tool string design based on the one or more atoms, wherein the tool string design comprises an indication of one or more tools used to form a tool string for performing the tool string process in the wellbore, and wherein the tool string design satisfies the merit function.

A twentieth embodiment can include the method of the nineteenth embodiment, wherein the merit function further comprises one or more constraints for performing the tool string process in the wellbore.

A twenty first embodiment can include the method of the nineteenth or twentieth embodiment, wherein the tool string design further comprises an ordering of the one or more tools in the tool string.

A twenty second embodiment can include the method of any one of the nineteenth to twenty first embodiments, wherein the tool string design comprises: a first tool string design for a first tool string, wherein the first tool string is used to perform a first process in the wellbore; and a second tool string design for a second tool string, wherein the second tool string is used to perform a second process in the wellbore, wherein the second process is performed after the first process.

A twenty third embodiment can include the method of the twenty second embodiment, wherein the first tool string is removed from the wellbore between the first process and the second process.

A twenty fourth embodiment can include the method of any one of the nineteenth to twenty third embodiments, wherein the sparse coding process comprises a matching pursuit (MP) algorithm, an orthogonal matching pursuit (OMP) algorithm, or a basis pursuit (BP) algorithm.

A twenty fifth embodiment can include the method of any one of the nineteenth to twenty fourth embodiments, wherein the merit function comprises a predefined set of thresholds or values for one or more process criteria.

A twenty sixth embodiment can include the method of any one of the nineteenth to twenty fifth embodiments, wherein the one or more tools comprise: a carrier, a gauge carrier, a gauge, a recorder, a port, a slot, a carrier gun, a piston assembly, a valve, a bypass valve, a valve assembly, a shut-in valve, a circulation valve, a reverse circulation valve, a safety valve, a drain valve, a drill stem testing tool, a nozzle, a packer, a safety joint, a sample container, a perforating gun, a perforated pipe, a shoe, a sampling tool, a logging tool, a drill stem testing tool, a fracturing tool, a drilling tool, a completion tool, a perforating tool, a repair tool, a work over tool, or any components thereof.

A twenty seventh embodiment can include the method of any one of the nineteenth to twenty sixth embodiments, further comprising: forming a tool string using the tool string design; inserting the tool string into the wellbore; and performing the tool string process using the tool string in the wellbore.

In a twenty eighth embodiment, a method of developing a tool string design model comprises: creating a machine learning model, wherein the machine learning model is configured to correlate tool string process data with tool string data; training the machine learning model using training data; and developing a tool string design model based on the training, wherein the tool string design model is configured to determine a tool string design based on tool string process constraints and parameters.

A twenty ninth embodiment can include the method of the twenty eighth embodiment, wherein the machine learning model comprises a dictionary learning model, wherein the dictionary learning model comprises a dictionary of parameters.

A thirtieth embodiment can include the method of the twenty eighth or twenty ninth embodiment, wherein training the machine learning model comprises: using a sparse coding process, wherein a plurality of atoms are identified using the dictionary of parameters; and identifying a sub-set of atoms from the plurality of atoms using the sparse coding process.

A thirty first embodiment can include the method of any one of the twenty eighth to thirtieth embodiments, wherein the training data comprises historical data from tool string processes in one or more wellbores.

A thirty second embodiment can include the method of any one of the twenty eighth to thirty first embodiments, wherein the training data comprises a data set comprising at least one of a tool parameter, a tool string parameter, a wellbore parameter, a formation parameter, an operating parameter, or a combination thereof.

In a thirty third embodiment, a method for designing an optical element comprises: receiving a merit function, wherein the merit function comprises one or more defined optical characteristics for an optical element; and determining, with a computing system and based on the merit function, an optical element design, wherein the tool string design satisfies the merit function.

A thirty fourth embodiment can include the method of the thirty third embodiment, wherein the merit function defines a transmission spectrum, and wherein the optical element design comprises a thickness of one or more thin film layers on an optical element.

A thirty fifth embodiment can include the method of the thirty third or thirty fourth embodiment, wherein determining the optical element design comprises: performing sparse coding on a dictionary defined by a plurality of the one or more optical characteristics; and identifying the optical element design based on the sparse coding.

A thirty sixth embodiment can include the method of the thirty fifth embodiment, where determining the optical element design further comprises: performing a local optimization on the optical element design based on the sparse coding.

A thirty seventh embodiment can include the method of any one of the thirty third to thirty sixth embodiments, further comprising: providing the optical element having the optical element design; and disposing the optical element in a wellbore.

Embodiments are discussed herein with reference to the Figures. However, those skilled in the art will readily appreciate that the detailed description given herein with respect to these figures is for explanatory purposes as the systems and methods extend beyond these limited embodiments. For example, it should be appreciated that those skilled in the art will, in light of the teachings of the present description, recognize a multiplicity of alternate and suitable approaches, depending upon the needs of the particular application, to implement the functionality of any given detail described herein, beyond the particular implementation choices in the following embodiments described and shown. That is, there are numerous modifications and variations that are too numerous to be listed but that all fit within the scope of the present description. Also, singular words should be read as plural and vice versa and masculine as feminine and vice versa, where appropriate, and alternative embodiments do not necessarily imply that the two are mutually exclusive.

It is to be further understood that the present description is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present systems and methods. It must be noted that as used herein and in the appended claims (in this application, or any derived applications thereof), the singular forms "a," "an," and "the" include the plural reference unless the context clearly dictates otherwise. Thus, for example, a reference to "an element" is a reference to one or more elements and includes equivalents thereof known to those skilled in the art. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this description belongs. Preferred methods, techniques, devices, and materials are described, although any methods, techniques, devices, or materials similar or equivalent to those described herein may be used in the practice or testing of the present systems and methods. Structures described herein are to be understood also to refer to functional equivalents of such structures. The present systems and methods will now be described in detail with reference to embodiments thereof as illustrated in the accompanying drawings.

From reading the present disclosure, other variations and modifications will be apparent to persons skilled in the art. Such variations and modifications may involve equivalent and other features which are already known in the art, and which may be used instead of or in addition to features already described herein.

Although Claims may be formulated in this Application or of any further Application derived therefrom, to particular combinations of features, it should be understood that the scope of the disclosure also includes any novel feature or any novel combination of features disclosed herein either explicitly or implicitly or any generalization thereof, whether or not it relates to the same systems or methods as presently claimed in any Claim and whether or not it mitigates any or all of the same technical problems as do the present systems and methods.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

We claim:

1. A method for designing a tool string for use in a wellbore, the method comprising:
   receiving a merit function, wherein the merit function comprises one or more defined objectives for performing at least one process in a wellbore; and
   using a machine learning model on a computing system to determine, based on the merit function, a tool string design for a tool string, wherein the tool string design comprises a first tool string design for a first tool string, wherein the first tool string is used to perform a first process in the wellbore, wherein the first tool string design comprises a selection of a first tool from a plurality of tools and an arrangement for the first tool string, and wherein the machine learning model uses the merit function to determine the tool string design such that the tool string design satisfies the merit function.

2. The method of claim 1, further comprising;
   receiving one or more system constraints, wherein determining the tool string design is further based on the one or more system constraints, and wherein the tool string design satisfies the merit function and the one or more system constraints.

3. The method of claim 1, wherein the tool string design further comprises:
   a second tool string design for a second tool string, wherein the second tool string is used to perform a second process in the wellbore, wherein the second process is performed after the first process.

4. The method of claim 3, further comprising:
   forming the first tool string using the tool string design;
   inserting the first tool string into the wellbore; and
   performing the first process using the first tool string in the wellbore.

5. The method of claim 4, further comprising:
   forming the second tool string using the tool string design;
   inserting the second tool string into the wellbore; and
   performing the second process using the second tool string in the wellbore.

6. The method of claim 1, wherein the machine learning model comprises a sparse coding process.

7. The method of claim 6, wherein the sparse coding process comprises a matching pursuit (MP) algorithm, an orthogonal matching pursuit (OMP) algorithm, or a basis pursuit (BP) algorithm.

8. The method of claim 1, wherein the first tool comprises: a carrier, a gauge carrier, a gauge, a recorder, a port, a slot, a carrier gun, a piston assembly, a valve, a bypass valve, a valve assembly, a shut-in valve, a circulation valve, a reverse circulation valve, a safety valve, a drain valve, a drill stem testing tool, a nozzle, a packer, a safety joint, a sample container, a perforating gun, a perforated pipe, a shoe, a sampling tool, a logging tool, a drill stem testing tool, a fracturing tool, a drilling tool, a completion tool, a perforating tool, a repair tool, a work over tool, or any components thereof.

9. A system for determining a tool string design, the system comprising:
a processor;
a memory, wherein the memory comprises a machine learning model, and wherein the machine learning model, when executed on the processor, configures the processor to:
receive a merit function, wherein the merit function comprises one or more defined objectives for performing at least one process in a wellbore; and
determine, based on the merit function, a tool string design for a tool string, wherein the tool string design comprises a first tool string design for a first tool string, wherein the first tool string is used to perform a first process in the wellbore, wherein the first tool string design comprises a selection of a first tool from a plurality of tools and an arrangement for the first tool string, and wherein the machine learning model uses the merit function to determine the tool string design such that the tool string design satisfies the merit function.

10. The system of claim 9, wherein the processor is further configured to:
receive one or more system constraints, wherein the determination of the tool string design is further based on the one or more system constraints, and wherein the tool string design satisfies the merit function and the one or more system constraints.

11. The system of claim 9, wherein the tool string design further comprises:
a second tool string design for a second tool string, wherein the second tool string is configured to perform a second process in the wellbore.

12. The system of claim 9, wherein the machine learning model comprises a dictionary learning model used with sparse coding, and wherein the sparse coding process comprises a matching pursuit (MP) algorithm, an orthogonal matching pursuit (OMP) algorithm, or a basis pursuit (BP) algorithm.

13. The system of claim 9, wherein the first tool comprises one or more tools comprise: a carrier, a gauge carrier, a gauge, a recorder, a port, a slot, a carrier gun, a piston assembly, a valve, a bypass valve, a valve assembly, a shut-in valve, a circulation valve, a reverse circulation valve, a safety valve, a drain valve, a drill stem testing tool, a nozzle, a packer, a safety joint, a sample container, a perforating gun, a perforated pipe, a shoe, a sampling tool, a logging tool, a drill stem testing tool, a fracturing tool, a drilling tool, a completion tool, a perforating tool, a repair tool, a work over tool, or any components thereof.

14. A method for designing a tool string for use in a wellbore, the method comprising:
receiving a merit function, wherein the merit function comprises one or more defined objectives for performing at least one tool string process in a wellbore;
using a machine learning model on a computing system to determine, determining, using a dictionary learning algorithm with sparse coding, one or more atoms based on the merit function, wherein the dictionary learning algorithm uses a dictionary of system parameters, wherein a plurality of atoms are defined by combinations of the system parameters from the dictionary, and wherein the plurality of atoms represent a sparse representation of the system parameters; and
using the machine learning model on a computing system to determine a tool string design based on the one or more atoms, wherein the tool string design comprises a first tool string design for a first tool string, wherein the first tool string is used to perform a first process in the wellbore, wherein the first tool string design comprises a selection of a first tool from a plurality of tools and an arrangement for the first tool string, and wherein the machine learning model uses the one or more atoms based on the merit function to determine the tool string design such that the tool string design satisfies the merit function.

15. The method of claim 14, wherein the sparse coding comprises a matching pursuit (MP) algorithm, an orthogonal matching pursuit (OMP) algorithm, or a basis pursuit (BP) algorithm.

16. The method of claim 14, further comprising:
forming the first tool string using the tool string design;
inserting the first tool string into the wellbore; and
performing the first process using the first tool string in the wellbore.

17. The method of claim 16, wherein the tool string design further comprises:
a second tool string design for a second tool string, wherein the second tool string is used to perform a second process in the wellbore, wherein the second process is performed after the first process.

18. The method of claim 17, further comprising:
forming the second tool string using the tool string design;
inserting the second tool string into the wellbore; and
performing the second process using the second tool string in the wellbore.

19. The method of claim 14, wherein the first tool comprises: a carrier, a gauge carrier, a gauge, a recorder, a port, a slot, a carrier gun, a piston assembly, a valve, a bypass valve, a valve assembly, a shut-in valve, a circulation valve, a reverse circulation valve, a safety valve, a drain valve, a drill stem testing tool, a nozzle, a packer, a safety joint, a sample container, a perforating gun, a perforated pipe, a shoe, a sampling tool, a logging tool, a drill stem testing tool, a fracturing tool, a drilling tool, a completion tool, a perforating tool, a repair tool, a work over tool, or any components thereof.

* * * * *